United States Patent
Enomoto et al.

(10) Patent No.: US 12,230,523 B2
(45) Date of Patent: Feb. 18, 2025

(54) SUBSTRATE PROCESSING APPARATUS AND IMAGE CAPTURING METHOD

(71) Applicant: Tokyo Electron Limited, Tokyo (JP)

(72) Inventors: Tadashi Enomoto, Iwate (JP); Nao Akashi, Hokkaido (JP); Yutai Matsuhashi, Iwate (JP); Masakazu Yamamoto, Iwate (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 366 days.

(21) Appl. No.: 17/889,624

(22) Filed: Aug. 17, 2022

(65) Prior Publication Data
US 2023/0154776 A1 May 18, 2023

(30) Foreign Application Priority Data
Aug. 18, 2021 (JP) .................. 2021-133061

(51) Int. Cl.
- *H01L 21/67* (2006.01)
- *H01L 21/673* (2006.01)
- *H01L 21/68* (2006.01)

(52) U.S. Cl.
CPC ...... *H01L 21/67309* (2013.01); *H01L 21/681* (2013.01)

(58) Field of Classification Search
CPC ............ H01L 21/67309; H01L 21/681; H01L 21/67265; H01L 21/67303; H01L 21/67757; H01L 21/67778; H01L 21/67259; H01L 21/67098; H01L 21/67781
See application file for complete search history.

(56) References Cited

U.S. PATENT DOCUMENTS

| | | | | |
|---|---|---|---|---|
| 9,816,182 | B2 * | 11/2017 | Tateno | C23C 16/45561 |
| 2015/0140835 | A1 * | 5/2015 | Tateno | H01L 21/67109 118/724 |
| 2019/0309420 | A1 * | 10/2019 | Oikawa | H01L 21/02532 |

FOREIGN PATENT DOCUMENTS

JP        2019-046843 A      3/2019

\* cited by examiner

*Primary Examiner* — Abdullahi Nur
(74) *Attorney, Agent, or Firm* — Venjuris, P.C.

(57) ABSTRACT

A substrate processing apparatus includes: a chamber that accommodates a boat; a transfer mechanism that is provided inside the chamber, and transfers a substrate; a first camera that captures an image of a support column of the boat and the substrate; a support member that is inserted through an opening formed in a wall surface of the chamber, and supports the first camera; and a driver that drives the support member in order to move the first camera between a standby position and a measurement position.

8 Claims, 15 Drawing Sheets

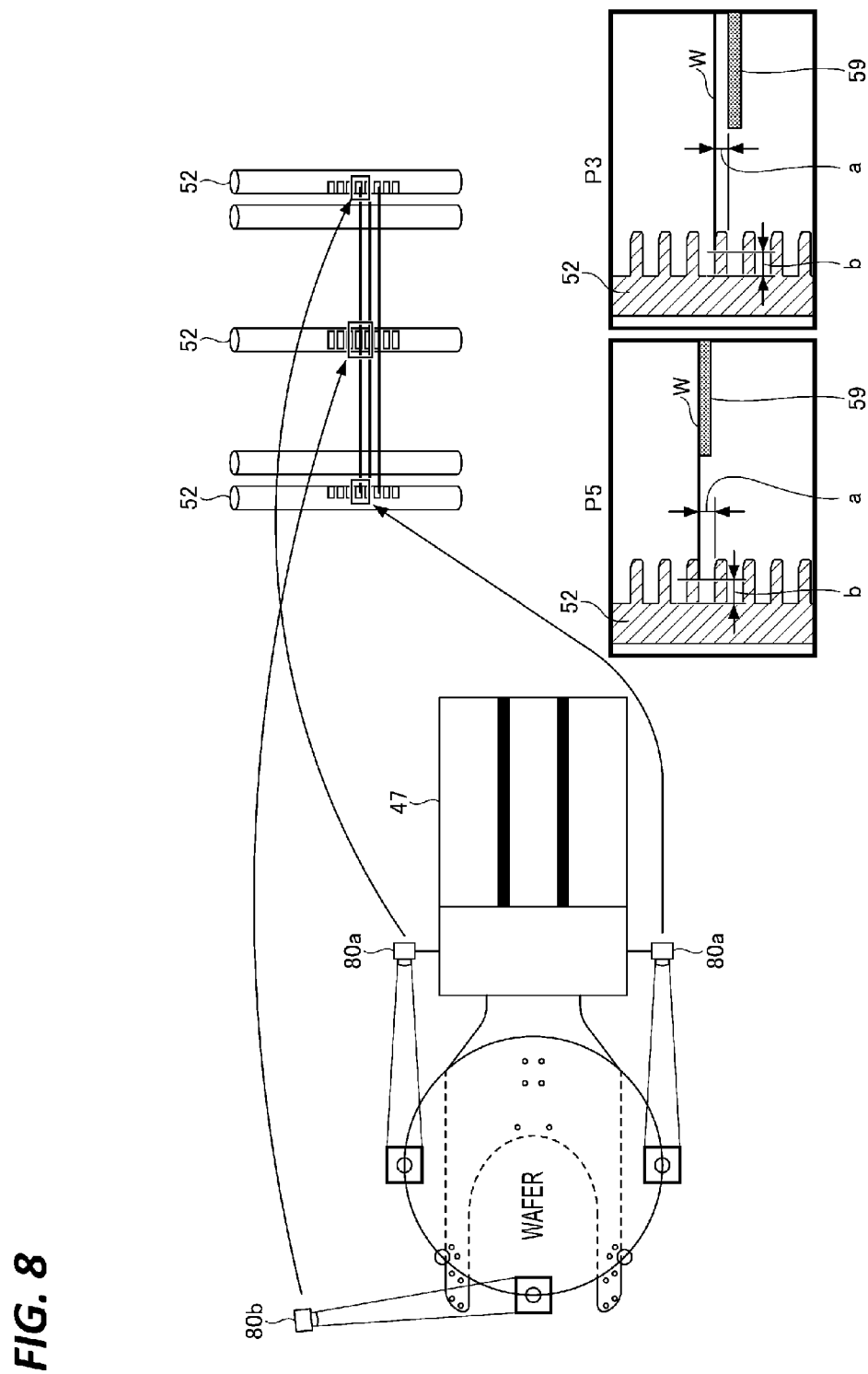

SUBSTRATE PROCESSING APPARATUS AND IMAGE CAPTURING METHOD

CROSS-REFERENCE TO RELATED APPLICATIONS

This application is based on and claims priority from Japanese Patent Application No. 2021-133061, filed on Aug. 18, 2021, with the Japan Patent Office, the disclosure of which is incorporated herein in its entirety by reference.

TECHNICAL FIELD

The present disclosure relates to a substrate processing apparatus and an image capturing method.

BACKGROUND

A vertical-type thermal processing apparatus is known which includes a vertically elongated thermal processing furnace, accommodates a wafer boat in the thermal processing furnace in a state where a plurality of wafers is placed on the wafer boat, and performs a thermal processing for heating the wafers. In the vertical-type thermal processing apparatus, a wafer transfer device having a plurality of forks simultaneously transfers a plurality of wafers stored in a carrier to the wafer boat (see, e.g., Japanese Laid-Open Patent Publication No. 2019-046843).

SUMMARY

According to an aspect of the present disclosure, a substrate processing apparatus includes: a chamber configured to accommodate a boat; a transfer mechanism provided inside the chamber, and configured to transfer a substrate; a first camera configured to capture an image of a support column of the boat and the substrate; a support member inserted through an opening formed in a wall surface of the chamber, and configured to support the first camera; and a driver configured to drive the support member in order to move the first camera between a standby position and a measurement position.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIG. 8 is an image view of an example of a boat into which a fork is inserted.

DETAILED DESCRIPTION

Figure 1:
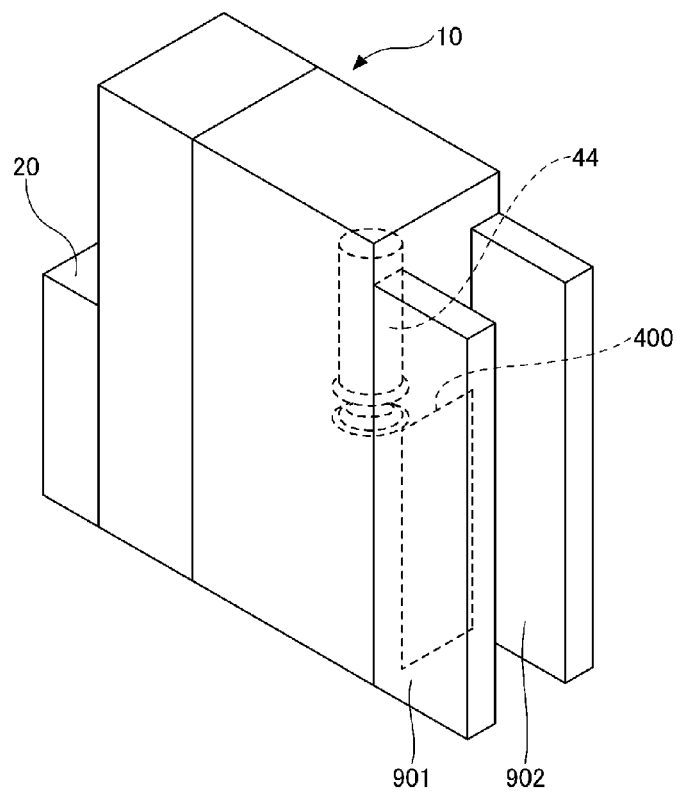
FIG. 1 is an example of a perspective view of a thermal processing apparatus when viewed from a rear side.

In the following detailed description, reference is made to the accompanying drawings, which form a part hereof. The illustrative embodiments described in the detailed description, drawings, and claims are not meant to be limiting. Other embodiments may be utilized, and other changes may be made without departing from the spirit or scope of the subject matter presented here.

Hereinafter, embodiments for implementing the present disclosure will be described with reference to the drawings. In the respective drawings, the same components will be denoted by the same reference numerals, and overlapping descriptions thereof may be omitted.

Figure 2:
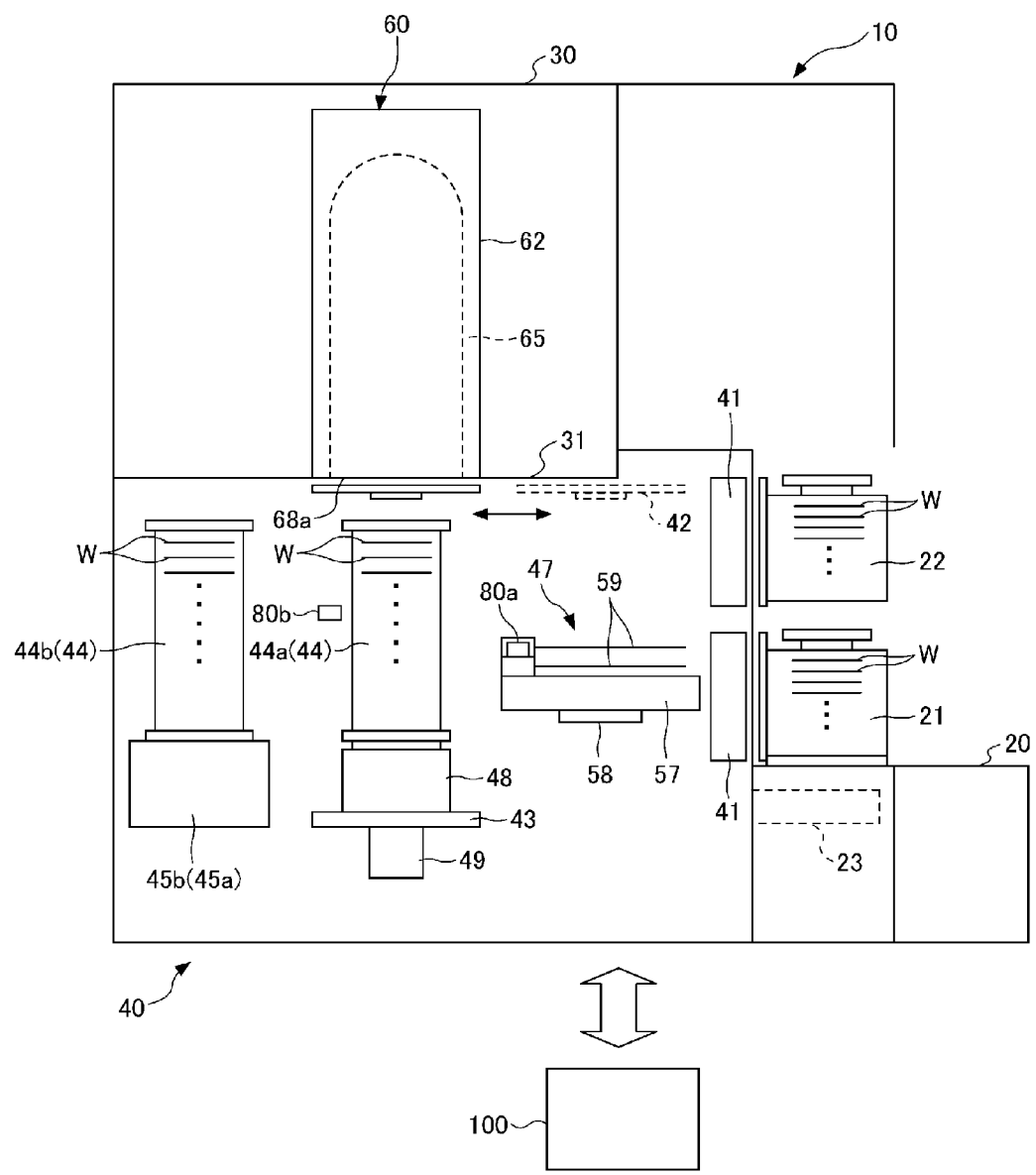
FIG. 2 is a vertical cross-sectional view schematically illustrating an example of a substrate processing system according to an embodiment.
Figure 3:
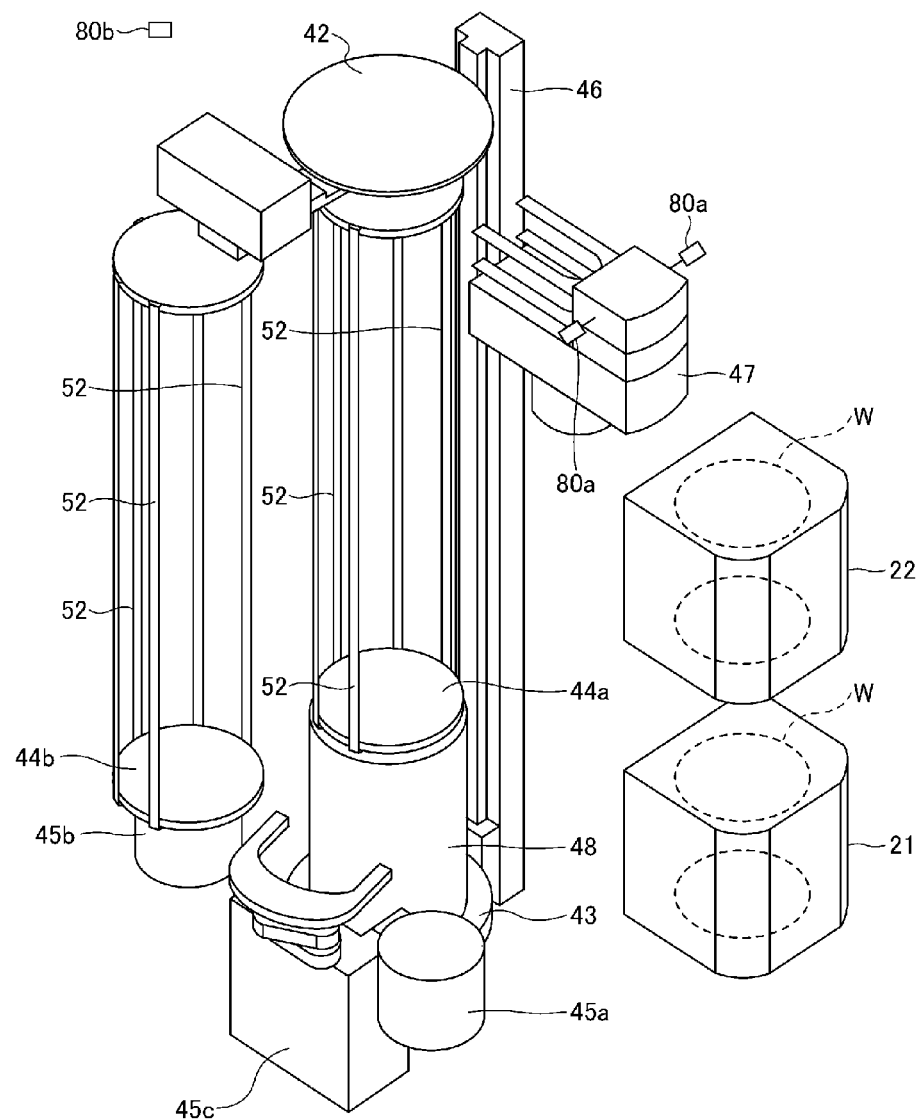
FIG. 3 is a perspective view schematically illustrating an example of a loading area.

FIG. 1 is an example of a perspective view of a thermal processing apparatus 10 when viewed from rear side. FIG. 2 is a vertical cross-sectional view schematically illustrating an example of a substrate processing system according to an embodiment. FIG. 3 is a perspective view schematically illustrating an example of a loading area. As illustrated in FIG. 2, the substrate processing system includes a thermal processing apparatus 10 and a control device 100. The control device 100 may be provided inside the housing of the thermal processing apparatus 10 as a portion of the configuration of the thermal processing apparatus 10, or may be provided outside the housing of the thermal processing apparatus 10 as a separate portion from the configuration of the thermal processing apparatus 10. For example, the control device 100 may be implemented by using, for example, a server device connected for a data communication via a network or a cloud service available via a network.

As illustrated in FIG. 2, the thermal processing apparatus 10 includes a vertical thermal processing furnace 60 to be described later, holds and accommodates a plurality of wafers W on a boat at predetermined intervals along the vertical direction, and may perform various types of thermal processing such as oxidation, diffusion, and decompressed CVD on the wafers W. Hereinafter, descriptions will be made on an example where the present disclosure is applied to the thermal processing apparatus 10 which supplies a processing gas to wafers W provided in a processing container 65 to be described later, thereby oxidizing the surfaces of the wafers W. Each wafer W is an example of a substrate to be processed. The substrate to be processed is not limited to a circular wafer W.

The thermal processing apparatus 10 of FIG. 2 includes a stage (load port) 20, a housing 30, and the control device 100. The stage (load port) 20 is provided on the front portion of the housing 30. The housing 30 includes a loading area (work area) 40 and the thermal processing furnace 60.

The loading area 40 is provided in the lower portion inside the housing 30. The thermal processing furnace 60 is provided above the loading area 40 inside the housing 30. A base plate 31 is provided between the loading area 40 and the thermal processing furnace 60.

The stage (load port) 20 is provided to carry the wafers W into and out from the housing 30. Storage containers 21 and 22 are placed on the stage (load port) 20. Each of the storage containers 21 and 22 is a closed storage container (front opening unified pod; FOUP) provided with a removable cover on the front face thereof, and capable of storing a plurality of (e.g., about 25) wafers W at predetermined intervals.

An alignment device (aligner) 23 may be provided below the stage 20 to align cutout portions (e.g., notches) formed in the outer peripheries of the wafers W transferred by a transfer mechanism 47 to be described later, in one direction.

The loading area (work area) 40 is provided to transfer the wafers W between the storage containers 21 and 22 and a boat 44 to be described later, so that the boat 44 is carried into the processing container 65 (loading), and is carried out from the processing container 65 (unloading). In the loading area 40, door mechanisms 41, a shutter mechanism 42, a lid 43, the boat 44, bases 45a and 45b, a lifting mechanism 46, and the transfer mechanism 47 are provided.

The door mechanisms 41 are provided to remove the covers of the storage containers 21 and 22, and open the storage containers 21 and 22 and the loading area 40 to communicate with each other. The shutter mechanism 42 is provided in the upper portion of the loading area 40. The shutter mechanism 42 is provided to cover (or block) a furnace opening 68a to be described later, in order to suppress or prevent the heat inside the high temperature furnace from being released into the loading area 40 through the furnace opening 68a, when the lid 43 is opened.

The lid 43 includes a heat insulating cylinder 48 and a rotation mechanism 49. The heat insulating cylinder 48 is provided on the lid 43. The heat insulating cylinder 48 prevents the boat 44 from being cooled by the heat transfer with the side of the lid 43, and keeps the boat 44 warm. The rotation mechanism 49 is attached to the lower portion of the lid 43. The rotation mechanism 49 rotates the boat 44. A rotary shaft of the rotation mechanism 49 airtightly penetrates the lid 43, and rotates a rotary table (not illustrated) disposed on the lid 43.

The lifting mechanism 46 moves the lid 43 up and down, when the boat 44 is carried from the loading area 40 into the processing container 65 and carried out from the processing container 65. When the lid 43 moved up by the lifting mechanism 46 is carried into the processing container 65, the lid 43 comes into contact with the furnace opening 68a to be described later, thereby sealing the furnace opening 68a. The boat 44 placed on the lid 43 may rotatably hold each wafer W within a horizontal plane inside the processing container 65.

The thermal processing apparatus 10 may include a plurality of boats 44. In the present embodiment, an example where two boats 44 are provided will be described with reference to FIG. 3.

Boats 44a and 44b are provided in the loading area 40. In the loading area 40, the bases 45a and 45b and a boat transfer mechanism 45c are provided. The bases 45a and 45b are stages onto which the boats 44a and 44b are transferred, respectively, from the lid 43. The boat transfer mechanism 45c transfers the boat 44a or 44b from the lid 43 onto the base 45a or 45b.

The boats 44a and 44b are made of, for example, quartz, and mount thereon the wafers W each having a large diameter, for example, a diameter of 300 mm, in a horizontal state at predetermined intervals (pitch width) in the vertical direction. The boats 44a and 44b are formed by, for example, interposing a plurality of (e.g., three) support columns 52 between a top plate and a bottom plate. Each support column 52 is provided with supports such as grooves or claws for supporting (holding) the wafers W. The boats 44a and 44b may be appropriately provided with auxiliary columns, in addition to the support columns 52. Each of the boats 44a and 44b is an example of a container in which the wafers W may be placed.

The transfer mechanism 47 transfers the wafers W between the storage container 21 or 22 and the boat 44a or 44b. The transfer mechanism 47 is an example of a transfer device that transfers the wafers W.

The transfer mechanism 47 includes a base 57, a lifting arm 58, and a plurality of forks 59. The base 57 is movable up and down and pivotable. The lifting arm 58 is movable vertically (up and down) by, for example, a ball screw. The base 57 is provided on the lifting arm 58 to be pivotable horizontally. The plurality of forks are an example of transfer plates (transfer units) that support the wafers W.

In the loading area 40, cameras 80a and 80b are provided. Each of the cameras 80a and 80b is an example of an image capturing device. The camera 80a is provided to capture images of the direction from the transfer mechanism 47 toward the storage container 21 or 22 and the direction from the transfer mechanism 47 toward the boat 44a or 44b. FIGS. 2 and 3 illustrate an example where the camera 80a is provided in the movable portion of the transfer mechanism 47.

For example, the camera 80a captures images of a moving operation in which the transfer mechanism 47 acquires (gets) the wafers W from the storage container 21 or 22, and a moving operation in which the transfer mechanism 47 places (puts) the wafers W on the boat 44a or 44b. Further, the camera 80a captures images of a moving operation in which the transfer mechanism 47 acquires the wafers W from the boat 44a or 44b, and a moving operation in which the transfer mechanism 47 places the wafers W in the storage container 21 or 22.

Figure 13A:
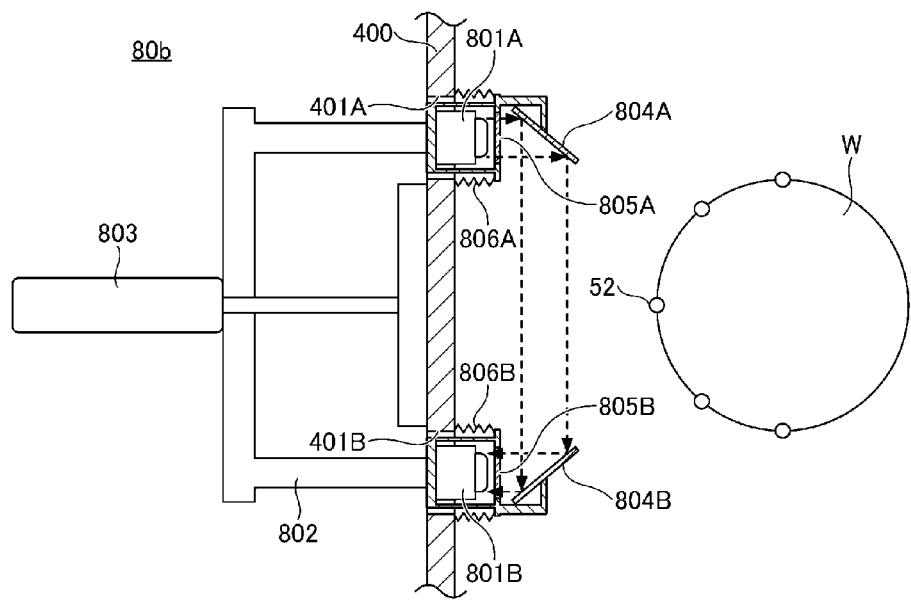
FIGS. 13A and 13B are views illustrating an example of a camera.
Figure 13B:
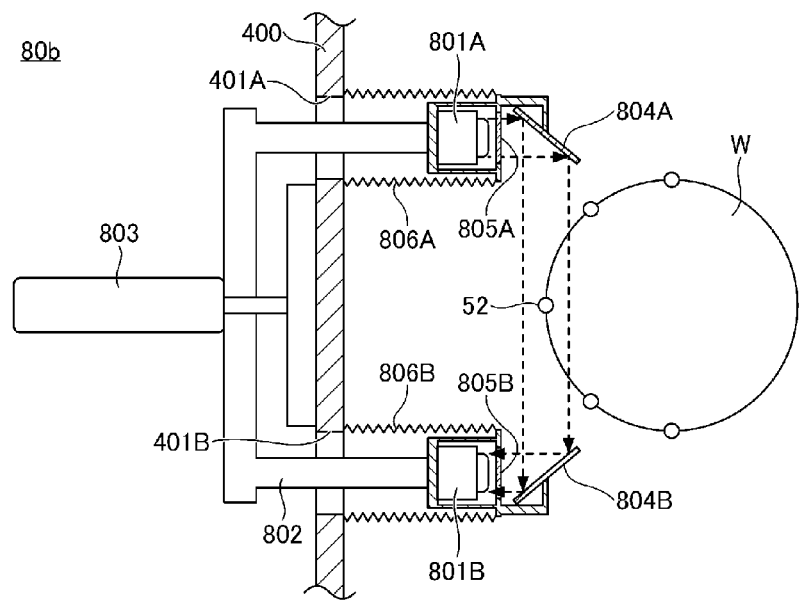

In FIGS. 2 and 3, the camera 80b is provided to capture an image of the rear surface of the boat 44a or 44b when viewed from the side of the transfer mechanism 47. The camera 80b of FIGS. 2 and 3 is provided in a back door 400 (see, e.g., FIG. 1) provided in the rear side wall of the housing 30 as illustrated in FIGS. 13A and 13B to be described later.

For example, the camera 80b captures an image of the moving operation in which the transfer mechanism 47 places the wafers W on the boat 44a or 44b. Further, the camera 80b captures an image of the moving operation in which the transfer mechanism 47 acquires the wafers W from the boat 44a or 44b.

The control device 100 controls the entire thermal processing apparatus 10. The control device 100 controls the operation of the thermal processing apparatus 10 such that a thermal processing is performed under various processing conditions represented in a recipe. Further, as described later, the control device 100 performs, for example, a full automatic teaching process for automatizing a teaching of a transfer position of the wafers W to the transfer mechanism 47, an autonomous automatic transfer process for autonomously controlling the transfer of the wafers W by the transfer mechanism 47 (autonomous navigation control), and an abnormality sign detecting process for supporting a preventive maintenance activity for the transfer mechanism 47.

As illustrated in FIG. 1, the back door 400 is provided in the rear side wall of the thermal processing apparatus 10, to transfer a replacement member such as the boat 44 into the loading area 40 (see, e.g., FIG. 2). Further, the rear surface of the thermal processing apparatus 10 is provided with accommodation portions 901 and 902 that accommodate, for example, a gas supply, an exhaust unit, and a power supply. A maintenance space is provided between the accommodation portions 901 and 902 outside the back door 400. When the replacement member is transferred into the loading area 40, an operator opens the back door 400, and transfers the replacement member into the loading area 40 through the maintenance space and the back door 400.

Figure 4:
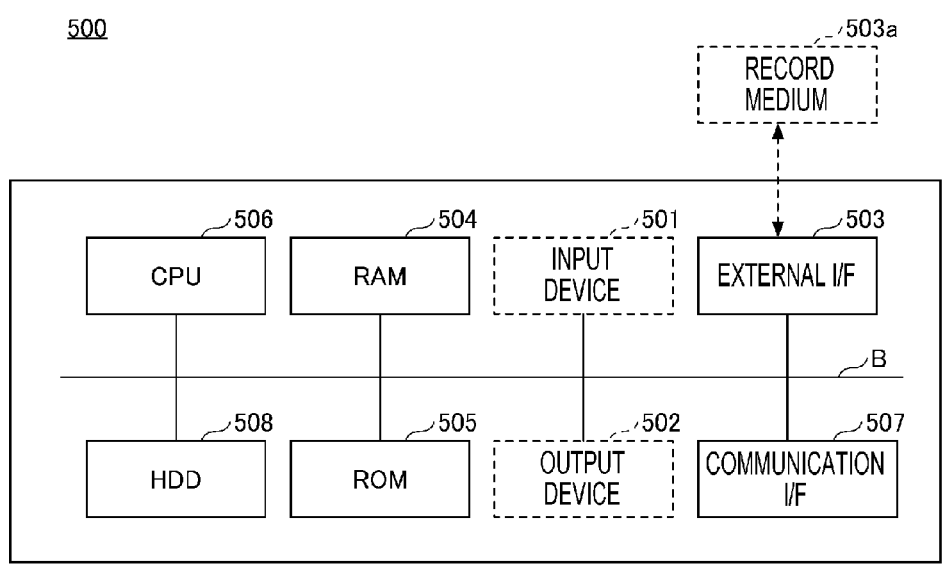
FIG. 4 is a hardware configuration diagram of an example of a computer.

The control device 100 is implemented by, for example, a computer having the hardware configuration illustrated in FIG. 4. FIG. 4 is a hardware configuration diagram of an example of the computer.

A computer 500 of FIG. 4 includes, for example, an input device 501, an output device 502, an external interface (I/F) 503, a random access memory (RAM) 504, a read only memory (ROM) 505, a central processing unit (CPU) 506, a communication I/F 507, and a hard disk drive (HDD) 508, and are connected to each other by a bus B. The input device 501 and the output device 502 may be connected and used when necessary.

The input device 501 is, for example, a keyboard, a mouse, or a touch panel, and is used when, for example, the operator inputs each operation signal. The output device 502 is, for example, a display, and displays results of processes performed by the computer 500. The communication I/F 507 connects the computer 500 to a network. The HDD 508 is an example of a nonvolatile storage device that stores programs or data.

The external I/F 503 is an interface with an external device. The computer 500 may perform reading and/or writing of a record medium 503a such as a secure digital (SD) memory card via the external I/F 503. The ROM 505 is an example of a nonvolatile semiconductor memory (storage device) in which programs or data are stored. The RAM 504 is an example of a volatile semiconductor memory (storage device) that temporarily holds programs or data.

The CPU 506 is an arithmetic device that implements the entire control or functions of the computer 500 by reading programs or data from the storage device such as the ROM 505 or the HDD 508 onto the RAM 504 and executing processes.

The control device 100 may implement various functions to be described later in the manner that the computer 500 having the hardware configuration illustrated in FIG. 4 executes processes according to programs.

<Functional Configuration>

Figure 5:
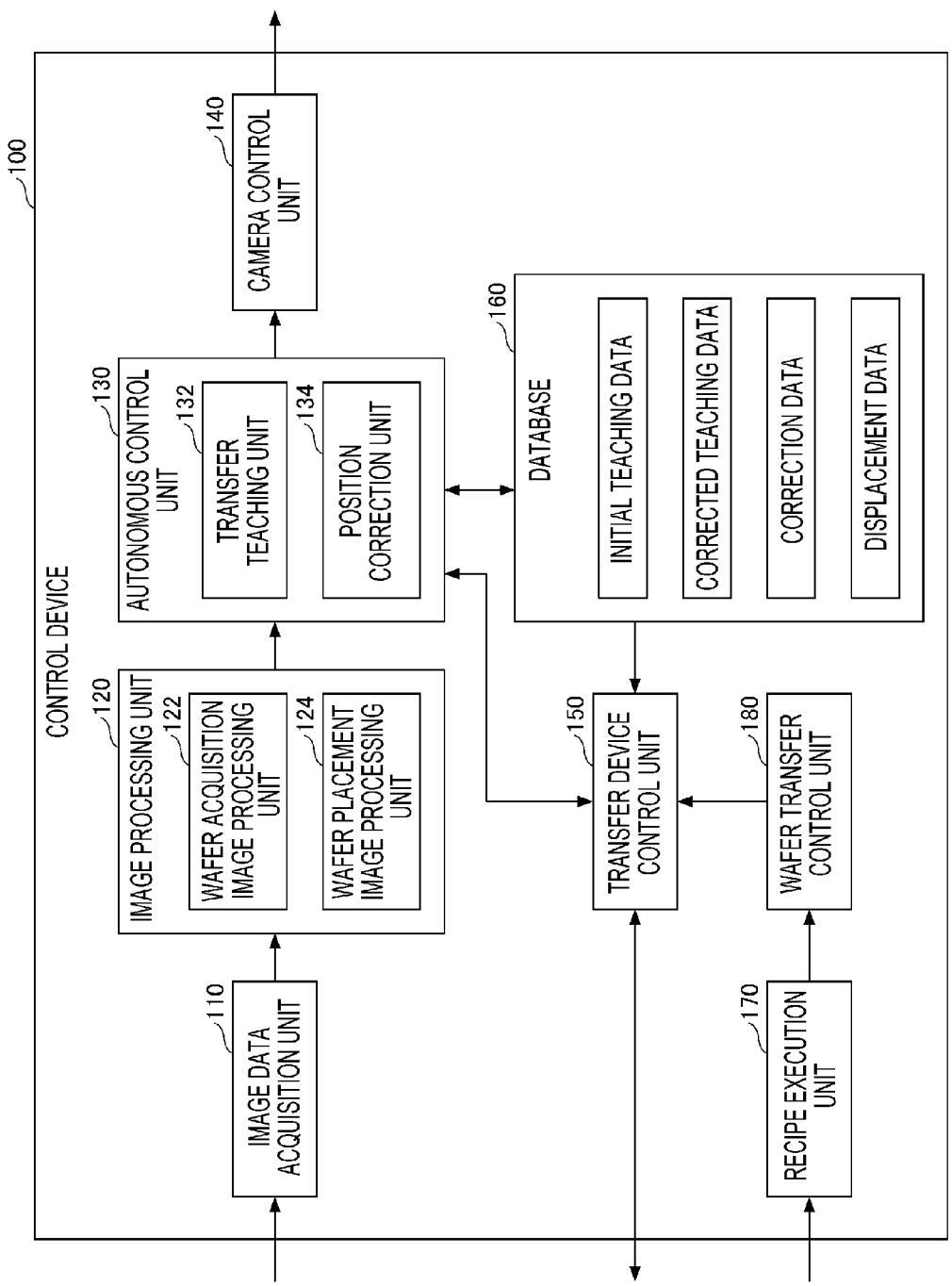
FIG. 5 is a view illustrating an example of a functional configuration of a control device.

An example of the functional configuration of the control device 100 will be described with reference to FIG. 5. FIG. 5 is a view illustrating an example of the functional configuration of the control device. The control device 100 includes an image data acquisition unit 110, an image processing unit 120, an autonomous control unit 130, a camera control unit 140, a transfer device control unit 150, a database 160, a recipe execution unit 170, and a wafer transfer control unit 180.

The image processing unit 120 includes a wafer acquisition image processing unit 122 and a wafer placement image processing unit 124. The autonomous control unit 130 includes a transfer teaching unit 132 and a position correction unit 134. The functional configuration of FIG. 5 appropriately omits the functional configuration unnecessary for the description of the present embodiment.

The image data acquisition unit 110 acquires image data captured by the cameras 80a and 80b (hereinafter, collectively referred to as the cameras 80 as appropriate). For example, the image data acquisition unit 110 acquires image data of the moving operation in which the transfer mechanism 47 acquires the wafers W from the storage container 21 or 22, and the moving operation in which the transfer mechanism 47 places the wafers W on the boat 44a or 44b. Further, for example, the image data acquisition unit 110 acquires image data of the moving operation in which the transfer mechanism 47 acquires the wafers W from the boat 44a or 44b, and the moving operation in which the transfer mechanism 47 places the wafers W on the boat 44a or 44b.

The image processing unit 120 performs an image processing on the image data acquired by the image data acquisition unit 110, to analyze (measure) necessary distances (dimensions) from a position of a support such as a groove or claw of the storage container 21 or 22, a position of a fork 59 of the transfer mechanism 47, and a position of a wafer W, and digitize a positional relationship. In the following, descriptions will be made assuming that the supports of the storage container 21 or 22 are grooves.

Further, the image processing unit 120 performs an image processing on the image data acquired by the image data acquisition unit 110, to analyze (measure) necessary distances (dimensions) from a position of a support such as a groove or claw of the boat 44a or 44b, a position of a fork 59 of the transfer mechanism 47, and a position of a wafer W, and digitize a positional relationship. In the following, descriptions will be made assuming that the supports of the boat 44a or 44b are grooves.

The wafer acquisition image processing unit 122 of the image processing unit 120 performs an image processing on the image data of the moving operation of acquiring the wafers W from the storage container 21 or 22, to analyze necessary distances from a position of a groove of the storage container 21 or 22, a position of a fork 59 of the transfer mechanism 47, and a position of a wafer W, and digitize a positional relationship.

Further, the wafer acquisition image processing unit 122 of the image processing unit 120 performs an image processing on the image data of the moving operation of acquiring the wafers W from the boat 44a or 44b, to analyze necessary distances from a position of a groove of the boat 44a or 44b, a position of a fork 59 of the transfer mechanism 47, and a position of a wafer W, and digitize a positional relationship.

The wafer placement image processing unit 124 of the image processing unit 120 performs an image processing on the image data of the moving operation of placing the wafers W on the boat 44a or 44b, to analyze necessary distances from a position of a groove of the boat 44a or 44b, a position of a fork 59 of the transfer mechanism 47, and a position of a wafer W, and digitize a positional relationship.

Further, the wafer placement image processing unit 124 of the image processing unit 120 performs an image processing on the image data of the moving operation of placing the wafers W in the storage container 21 or 22, to analyze necessary distances from a position of a groove of the storage container 21 or 22, a position of a fork 59 of the transfer mechanism 47, and a position of a wafer W, and digitize a positional relationship.

Based on the digitized positional relationship among the position of the groove of the storage container 21 or 22, the position of the fork 59 of the transfer mechanism 47, and the position of the wafer W, the autonomous control unit 130 calculates corrected teaching data for the placement position of the wafers W in the storage container 21 or 22, and performs a teaching of the transfer position of the wafers W to the transfer mechanism 47. For example, the corrected teaching data for the placement position of the wafers W in the storage container 21 or 22 is used to correct initial teaching data for the moving operation in which the forks 59 of the transfer mechanism 47 acquire the wafers W from the storage container 21 or 22, or the moving operation in which the forks 59 of the transfer mechanism 47 place the wafers W in the storage container 21 or 22.

Based on the digitized positional relationship among the position of the groove of the boat 44a or 44b, the position of the fork 59 of the transfer mechanism 47, and the position of the wafer W, the autonomous control unit 130 calculates corrected teaching data for the placement position of the wafers W on the boat 44a or 44b, and performs a teaching of the transfer position of the wafers W to the transfer mechanism 47. For example, the corrected teaching data for the placement position of the wafers W on the boat 44a or 44b is used to correct initial teaching data for the moving operation in which the forks 59 of the transfer mechanism 47 acquire the wafers W from the boat 44a or 44b, or the moving operation in which the forks 59 of the transfer mechanism 47 place the wafers W on the boat 44a or 44b.

Further, the autonomous control unit 130 implements an autonomous navigation process, by measuring the transfer position of the wafers W which are transferred between the storage container 21 or 22 and the boat 44a or 44b according to the corrected teaching data, at predetermined intervals, and performing a position correction to be described later when a position deviation occurs.

Based on the positional relationship among the position of the groove of the storage container 21 or 22, the position of the fork 59 of the transfer mechanism 47, and the position of the wafer W digitized by performing the image processing on the image data for the moving operation of acquiring the wafers W from the storage container 21 or 22, the transfer teaching unit 132 of the autonomous control unit 130 calculates corrected teaching data for the placement position of the wafers W in the storage container 21 or 22.

Further, based on the positional relationship among the position of the groove of the boat 44a or 44b, the position of the fork 59 of the transfer mechanism 47, and the position of the wafer W digitized by performing the image processing on the image data for the moving operation of acquiring the wafers W from the boat 44a or 44b, the transfer teaching unit 132 of the autonomous control unit 130 calculates corrected teaching data for the placement position of the wafers W on the boat 44a or 44b.

Further, based on the positional relationship among the position of the groove of the boat 44a or 44b, the position of the fork 59 of the transfer mechanism 47, and the position of the wafer W digitized by performing the image processing on the image data for the moving operation of placing the wafers W on the boat 44a or 44b, the transfer teaching unit 132 of the autonomous control unit 130 calculates corrected teaching data for the placement position of the wafers W on the boat 44a or 44b.

Further, based on the positional relationship among the position of the groove of the storage container 21 or 22, the position of the fork 59 of the transfer mechanism 47, and the position of the wafer W digitized by performing the image processing on the image data for the moving operation of placing the wafers W in the storage container 21 or 22, the transfer teaching unit 132 of the autonomous control unit 130 calculates corrected teaching data for the placement position of the wafers W in the storage container 21 or 22.

The position correction unit 134 of the autonomous control unit 130 implements the autonomous navigation process, by measuring the transfer position of the wafers W which are transferred between the storage container 21 or 22 and the boat 44a or 44b according to the corrected teaching data, at predetermined intervals, and performing the position correction to be described later when a position deviation occurs.

The camera control unit 140 controls a timing for the image capturing performed by the cameras 80a and 80b, according to an instruction from the autonomous control unit 130. The database 160 stores the initial teaching data and the corrected teaching data for teaching the placement position of the wafers W to the transfer mechanism 47 of the thermal processing apparatus 10. Further, the database 160 stores correction data and displacement data which are used for the position correction to be described later.

For example, the initial teaching data is preset in the thermal processing apparatus 10, and is set for each apparatus type of the thermal processing apparatus 10. The corrected teaching data is teaching data obtained by correcting a positional deviation of the placement position of the wafers W caused from a machine difference of the thermal processing apparatus 10 or a variation of adjustment by the operator. The correction data is used for continuing to transfer the wafers W while correcting an occurring positional deviation of the placement position of the wafers W, based on results obtained by periodically measuring the transfer position of the wafers W transferred according to the corrected teaching data. The displacement data is obtained by continuously recording an occurring positional deviation of the placement position of the wafers W, and is used for analyzing various aspects (e.g., a trend, a behavior, a failure, and an abnormality).

The transfer device control unit 150 controls the moving operation of the transfer mechanism 47 according to a control from the autonomous control unit 130 or the wafer transfer control unit 180. The transfer device control unit 150 controls the moving operation of the transfer mechanism 47, by using the initial teaching data, the corrected teaching data, and the correction data stored in the database 160.

The recipe execution unit 170 controls the operation of the thermal processing apparatus 10 such that a thermal processing is performed under processing conditions represented in a recipe. The wafer transfer control unit 180 instructs the transfer device control unit 150 to transfer the wafers W between the storage container 21 or 22 and the boat 44a or 44b, according to a control from the recipe execution unit 170.

<Process>

Figure 6:
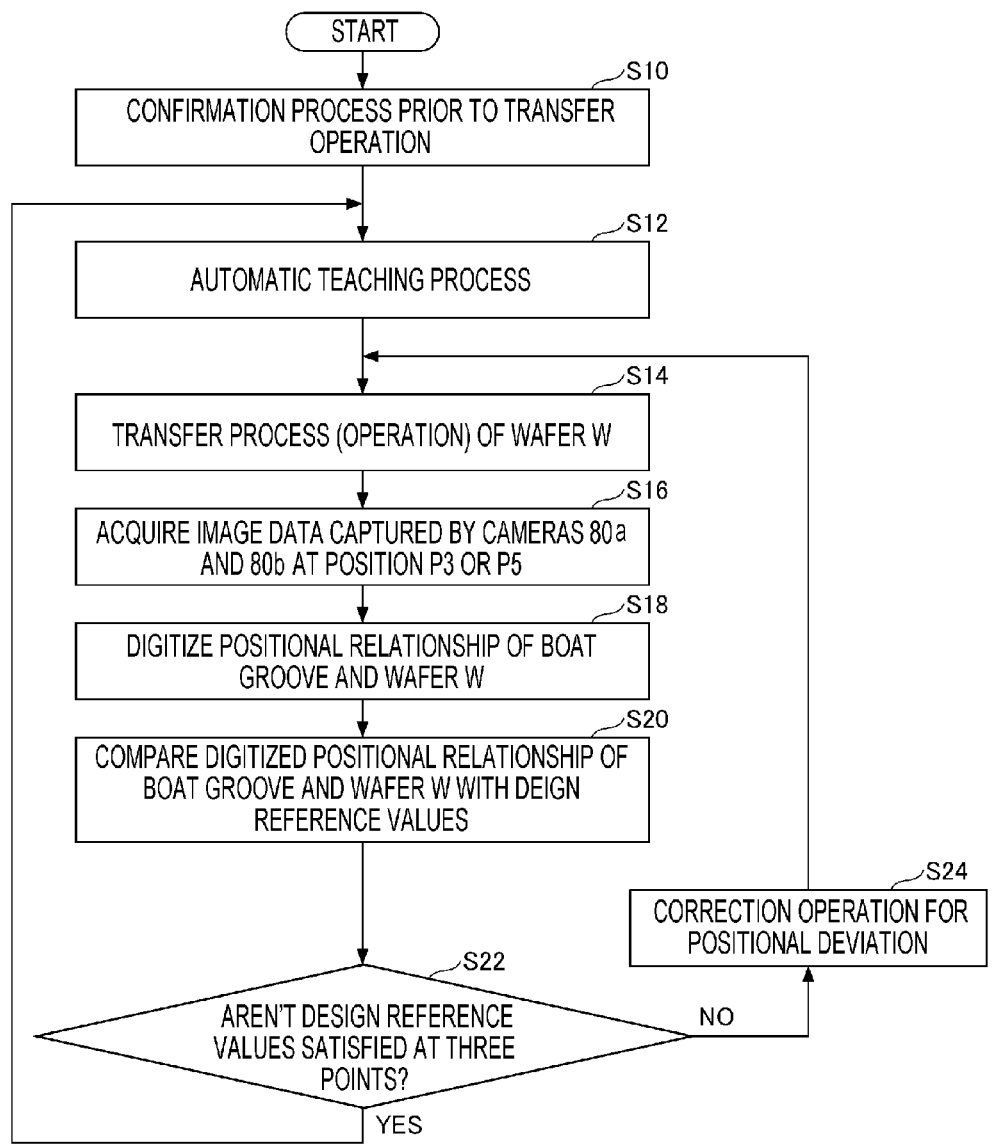
FIG. 6 is a flowchart of an example of a process for controlling a moving operation of a transfer mechanism according to an embodiment.

Hereinafter, descriptions will be made on an example of the full automatic teaching process for automatizing the teaching of the transfer mechanism 47 that transfers the wafers W between the storage container 21 or 22 and the boat 44a or 44b, and the autonomous transfer process for autonomously controlling the transfer of the wafers W by the transfer mechanism 47 (autonomous navigation control). The control device 100 controls the moving operation of the transfer mechanism 47 according to, for example, the procedure of FIG. 6. FIG. 6 is a flowchart of an example of the process of controlling the moving operation of the transfer mechanism according to the present embodiment.

In step S10, the control device 100 performs a confirmation process prior to a transfer operation. The confirmation process prior to the transfer operation in step S10 is performed before the transfer operation, and is a process of performing the moving operation of the forks 59 of the transfer mechanism 47 based on the initial teaching data without transferring the wafers W, so as to confirm the transfer position between the storage container 21 or 22 and the boat 44a or 44b.

Figure 7A:
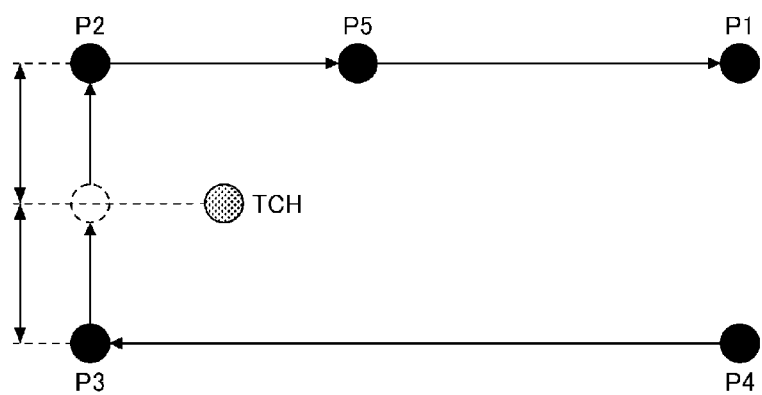
FIGS. 7A and 7B are views illustrating an example of a position change in a moving operation of a fork when a wafer W is acquired or placed.
Figure 7B:
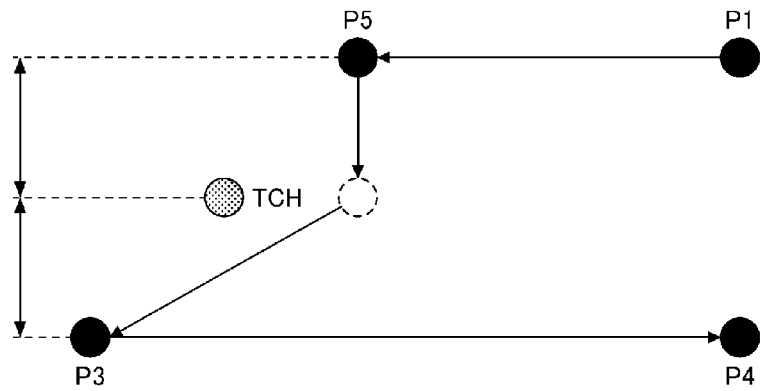

In the present embodiment, for example, FIGS. 7A and 7B define a position change in the moving operation of the forks 59 when the wafers W are acquired from a placement position or placed at a placement position, and a position where the cameras 80 capture images.

FIGS. 7A and 7B are views illustrating an example of the position change in the moving operation of the forks when the wafers W are acquired or placed. FIG. 7A illustrates an example of the position change in the moving operation of the forks 59 when the wafers W are acquired. FIG. 7B illustrates an example of the position change in the moving operation of the forks 59 when the wafers W are placed.

For example, FIG. 7A represents an example of the moving operation in which the forks 59 are moved along the positions P4→P3→P2→P5→P1 in this order. The position P3 in FIG. 7A is an example of a first position, and is, for example, a position immediately before the forks 59 acquire the wafers W from the boat 44a or 44b. The position TCH is, for example, a position where the forks 59 acquire the wafers W from the boat 44a or 44b. The position P2 is, for example, a position after the forks 59 acquire the wafers W from the boat 44a or 44b.

For example, FIG. 7B represents an example of the moving operation in which the forks 59 are moved along the positions P1→P5→P3→P4 in this order. The position P5 of FIG. 7B is an example of a second position, and is, for example, a position immediately before the forks 59 place the wafers W on the boat 44a or 44b. The position TCH is, for example, a position where the forks 59 place the wafers W on the boat 44a or 44b. The position P3 is, for example, a position after the forks 59 place the wafers W on the boat 44a or 44b.

The confirmation process prior to the transfer operation for the boat is performed according to, for example, the following procedure. The autonomous control unit 130 of the control device 100 reads the initial teaching data from the database 160. Based on the initial teaching data, the autonomous control unit 130 controls the transfer device control unit 150 to insert the forks 59 to reach the position P3 of the boat 44a.

The autonomous control unit 130 performs a control such that the cameras 80 capture images at the positions P3 and P5 of the boat 44a. The image data acquisition unit 110 acquires image data captured by the cameras 80 at the positions P3 and P5 of the boat 44a. The image processing unit 120 performs an image processing on the image data captured at the positions P3 and P5 of the boat 44a, to measure a distance between the upper portion of a groove of the support columns 52 of the boat 44a (hereinafter, referred to as a boat groove) and the wafer mounting surface of a fork 59. The image processing unit 120 measures a distance between the edge of the boat groove and the edge of the fork 59.

The autonomous control unit 130 determines whether the measured distance between the upper portion of the boat groove and the wafer mounting surface of the fork 59 and the measured distance between the edge of the boat groove and the edge of the fork 59, at the positions P3 and P5 of the boat 44a, satisfy design reference values. When it is determined that the design reference values are not satisfied, the autonomous control unit 130 performs a correction operation for the errors, so as to perform the position correction such that the moving operation of the forks 59 satisfies the design reference values. The autonomous control unit 130 performs a feedback by storing the corrected teaching data in the database 160 according to the result of the position correction of the moving operation of the forks 59 performed to satisfy the design reference values.

After the confirmation process prior to the transfer operation for the boat, the control device 100 performs a confirmation process prior to a transfer operation for the storage container. Since the size of a groove of the storage container 21 (hereinafter, referred to as a storage container groove) is sufficiently larger than that of the boat groove, the confirmation operation prior to the transfer operation for the storage container may be omitted.

The autonomous control unit 130 of the control device 100 reads the initial teaching data from the database 160. Based on the initial teaching data, the autonomous control unit 130 controls the transfer device control unit 150 to insert the forks 59 to reach the position P3 of the storage container 21.

The autonomous control unit 130 performs a control such that the camera 80a captures images at the positions P3 and P5 of the storage container 21. The image data acquisition unit 110 acquires image data captured by the camera 80a at the positions P3 and P5 of the storage container 21. The image processing unit 120 performs an image processing on the image data captured at the positions P3 and P5 of the storage container 21, to measure a distance between the upper portion of the storage container groove and the wafer mounting surface of the fork 59. The image processing unit 120 measures a distance between the edge of the storage container groove and the edge of the fork 59.

The autonomous control unit 130 determines whether the measured distance between the upper portion of the storage container groove and the wafer mounting surface of the fork 59, and the measured distance between the edge of the storage container groove and the edge of the fork 59, at the positions P3 and P5 of the storage container 21, satisfy design reference values. When it is determined that the design reference values are not satisfied, the autonomous control unit 130 performs a correction operation for the errors, so as to perform the position correction such that the moving operation of the forks 59 satisfy the design reference values. The autonomous control unit 130 performs a feedback by storing the corrected teaching data in the database 160 according to the result of the position correction of the moving operation of the forks 59 performed to satisfy the design reference values.

In step S12, the control device 100 performs the automatic teaching process. In the automatic teaching process of step S12, the moving operation of the forks 59 of the transfer mechanism 47 is performed based on the corrected teaching data obtained by correcting the initial teaching data by the confirmation process prior to the transfer operation in step S10.

The control device 100 acquires image data obtained by capturing images of the moving operation in which the forks 59 of the transfer mechanism 47 acquire the wafers W from the storage container 21 or 22, and digitizes the positional relationship among the groove of the storage container 21 or 22, the fork 59, and the wafer W through an image processing. Based on the digitized positional relationship among the groove of the storage container 21 or 22, the fork 59, and the wafer W, the control device 100 outputs the corrected teaching data for correcting the placement position of the wafers W in the storage container 21 or 22 (correcting the moving operation of the forks 59).

Further, the control device 100 acquires image data obtained by capturing images of the moving operation in which the forks 59 of the transfer mechanism 47 place the wafers W on the boat 44a or 44b, and digitizes the positional relationship among the groove of the boat 44a or 44b, the fork 59, and the wafer W through an image processing. The positional relationship among the groove of the boat 44a or 44b, the fork 59, and the wafer W may be called, for example, a fitting dimension of the boat 44a or 44b and the wafers W.

Based on the digitized positional relationship among the groove of the boat 44a or 44b, the fork 59, and the wafer W, the control device 100 outputs the corrected teaching data for correcting the placement position of the wafers W on the boat 44a or 44b (correcting the moving operation of the forks 59). The details of the automatic teaching process in step S12 will be described later.

In step S14, the control device 100 controls the moving operation of the transfer mechanism 47 and performs the transfer process of the wafers W, by using the corrected teaching data stored in the database 160, thereby operating the thermal processing apparatus 10. In the present embodiment, step 16 and its subsequent processes are performed at predetermined intervals such as regular intervals under the operation of the thermal processing apparatus 10.

In step S16, the autonomous control unit 130 performs a control such that the cameras 80a and 80b capture images at the position P3 or P5 of the boat 44a. For example, as illustrated in FIG. 8, the image data acquisition unit 110 acquires image data captured by the cameras 80a and 80b at the position P3 or P5 of the boat 44a. FIG. 8 is an image view of an example of the boat into which a fork is inserted. As illustrated in FIG. 8, the cameras 80a and 80b are provided to capture images of boat grooves at three points of the boat 44a.

In step S18, the image processing unit 120 performs an image processing on the image data captured by the cameras 80a and 80b at the position P3 or P5 of the boat 44a, to digitize a positional relationship between the boat groove and the wafer W.

For example, the image processing unit 120 performs an image processing on the image data captured by the cameras 80a and 80b at the position P5, to measure, for example, a distance "a" between the lower surface of the wafer W held by the fork 59 and the upper surface of the boat groove, and a distance "b" between the support column 52 and the edge of the wafer W. The image processing unit 120 performs an image processing on the image data captured by the cameras 80a and 80b at the position P3, to measure, for example, the distance "a" between the lower surface of the wafer W held by the fork 59 and the upper surface of the boat groove, and the distance "b" between the support column 52 and the edge of the wafer W.

In step S20, the autonomous control unit 130 compares the digitized positional relationship between the boat groove and the wafer W, with a design reference value, for each of the boat grooves of the three points. In step S22, the autonomous control unit 130 determines whether the design reference value is satisfied for each of the boat grooves of the three points.

For example, the autonomous control unit 130 compares the distance "a" digitized in step S18 between the lower surface of the wafer W held by the fork 59 and the upper surface of the boat groove, with a distance "a" of the design reference value, and determines whether the design reference value is satisfied at each of the boat grooves of the three points, according to the difference of the distances "a." When the difference between the digitized distance "a" between the lower surface of the wafer W held by the fork 59 and the upper surface of the boat groove, and the distance "a" of the design reference value falls within a predetermined range (e.g., less than 200 µm), the autonomous control unit 130 determines the distance "a" to be a normal value that satisfies the design reference value.

When the difference between the digitized distance "a" between the lower surface of the wafer W held by the fork 59 and the upper surface of the boat groove and the distance "a" of the design reference value falls within a predetermined range (e.g., 200 µm or more and less than 400 µm), the autonomous control unit 130 determines the distance "a" to be an adjustment recommendation value that does not satisfy the design reference value. When the difference between the digitized distance "a" between the lower surface of the wafer W held by the fork 59 and the upper surface of the boat groove and the distance "a" of the design reference value falls within a predetermined range (e.g., 400 µm or more), the autonomous control unit 130 determines the distance "a" to be an abnormal value that does not satisfy the design reference value.

For example, the autonomous control unit 130 compares the distance 'b" digitized in step S18 between the edge of the wafer W held by the fork 59 and the support column 52 with a distance "b" of the design reference value, and determines whether the design reference value is satisfied at each of the boat grooves of the three points, according to the difference of the distances "b." When the difference between the digitized distance "b" between the edge of the wafer W held by the fork 59 and the support column 52 and the distance "b" of the design reference value falls within a predetermined range (e.g., less than 200 µm), the autonomous control unit 130 determines the distance "b" to be a normal value that satisfies the design reference value.

When the difference between the digitized distance "b" between the edge of the wafer W held by the fork 59 and the support column 52 and the distance "b" of the design reference value falls within a predetermined range (e.g., 200 µm or more and less than 400 µm), the autonomous control unit 130 determines the distance "b" to be an adjustment recommendation value that does not satisfy the design reference value. When the difference between the digitized distance "b" between the edge of the wafer W held by the fork 59 and the support column 52 and the distance "b" of the design reference value falls within a predetermined range (e.g., 400 µm or more), the autonomous control unit 130 determines the distance "b" to be an abnormal value that does not satisfy the design reference value.

When the design reference value is satisfied at one or more of the boat grooves, the autonomous control unit 130 performs the process of step S24. In step S24, the autonomous control unit 130 performs a feedback by storing the correction data for correcting the corrected teaching data in the database 160, according to the result of the position correction of the moving operation of the forks 59 performed to satisfy the design reference value by performing the correction operation for the difference (positional deviation). Accordingly, the autonomous control unit 130 may continue the operation of the thermal processing apparatus 10 while correcting the position of the moving operation of the forks 59 to satisfy the design reference value.

While FIG. 6 describes, for example, the process in which the operation of the thermal processing apparatus 10 is continued while correcting the position of the moving operation of the forks 59 as long as one or more of the boat grooves of the three points has the normal value that satisfies the design reference, the present disclosure is not limited thereto. For example, when the boat grooves of the three points do not satisfy the design reference, but fall within the range of the adjustment recommendation value, the autonomous control unit 130 may continue the operation of the thermal processing apparatus 10 while correcting the position of the moving operation of the forks 59 until a processing of a batch which is being processed is completed. Further, when one or more of the boat grooves of the three points fall within the range of the abnormal value that does not satisfy the design reference, the autonomous control unit 130 may stop the operation of the thermal processing apparatus 10 before the processing of the batch which is being processed is completed.

When the design reference value is not satisfied at the boat grooves of the three points, the autonomous control unit 130 returns to the process of step S12, and performs the automatic teaching process illustrated in FIGS. 9 to 12.

Figure 9:
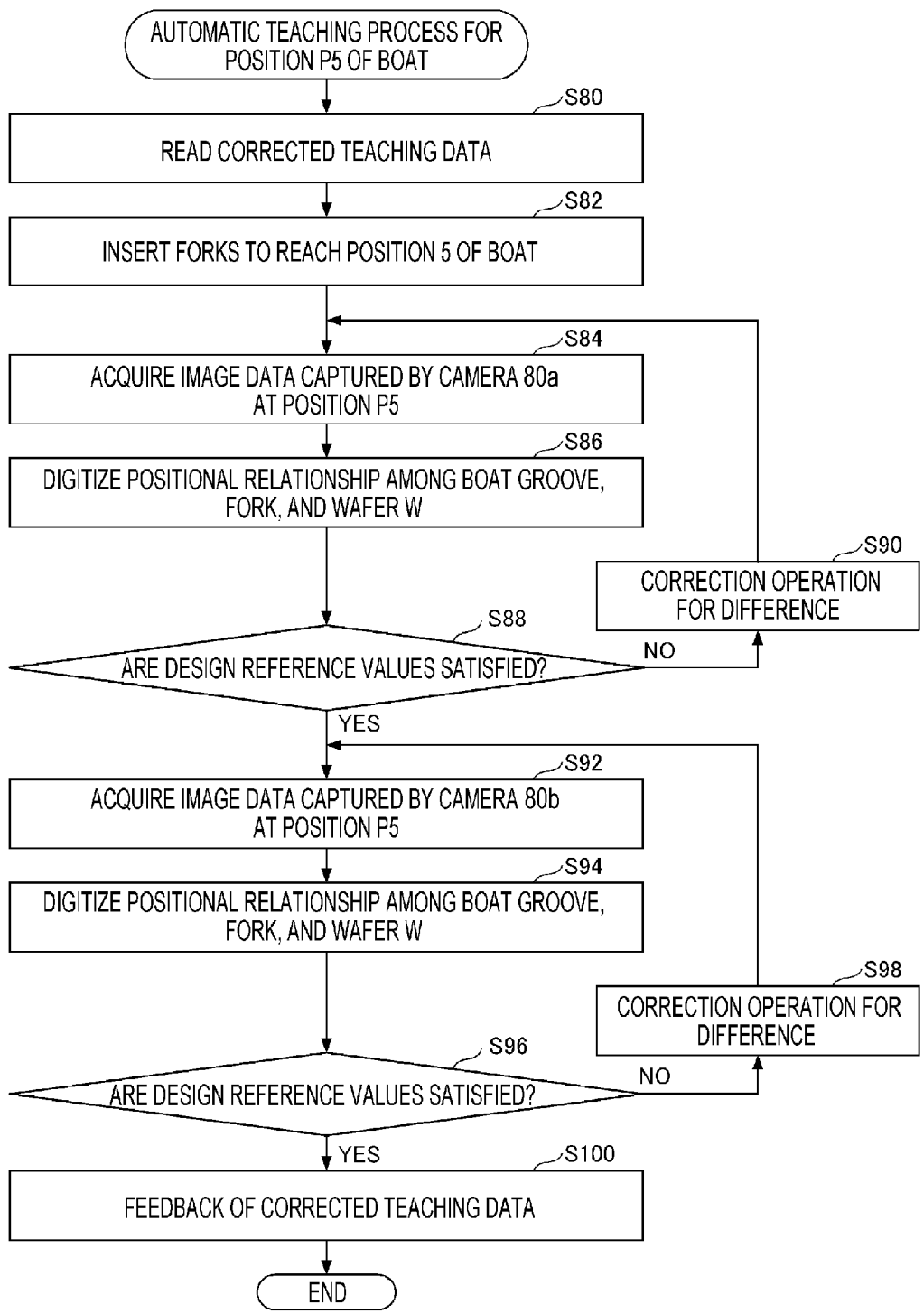
FIG. 9 is a flowchart of an example of an automatic teaching process for a fork according to an embodiment.

FIG. 9 is a flowchart of an example of the automatic teaching process for the boat according to the present embodiment. In step S80, the autonomous control unit 130 of the control device 100 reads the corrected teaching data from the database 160.

Figure 10:
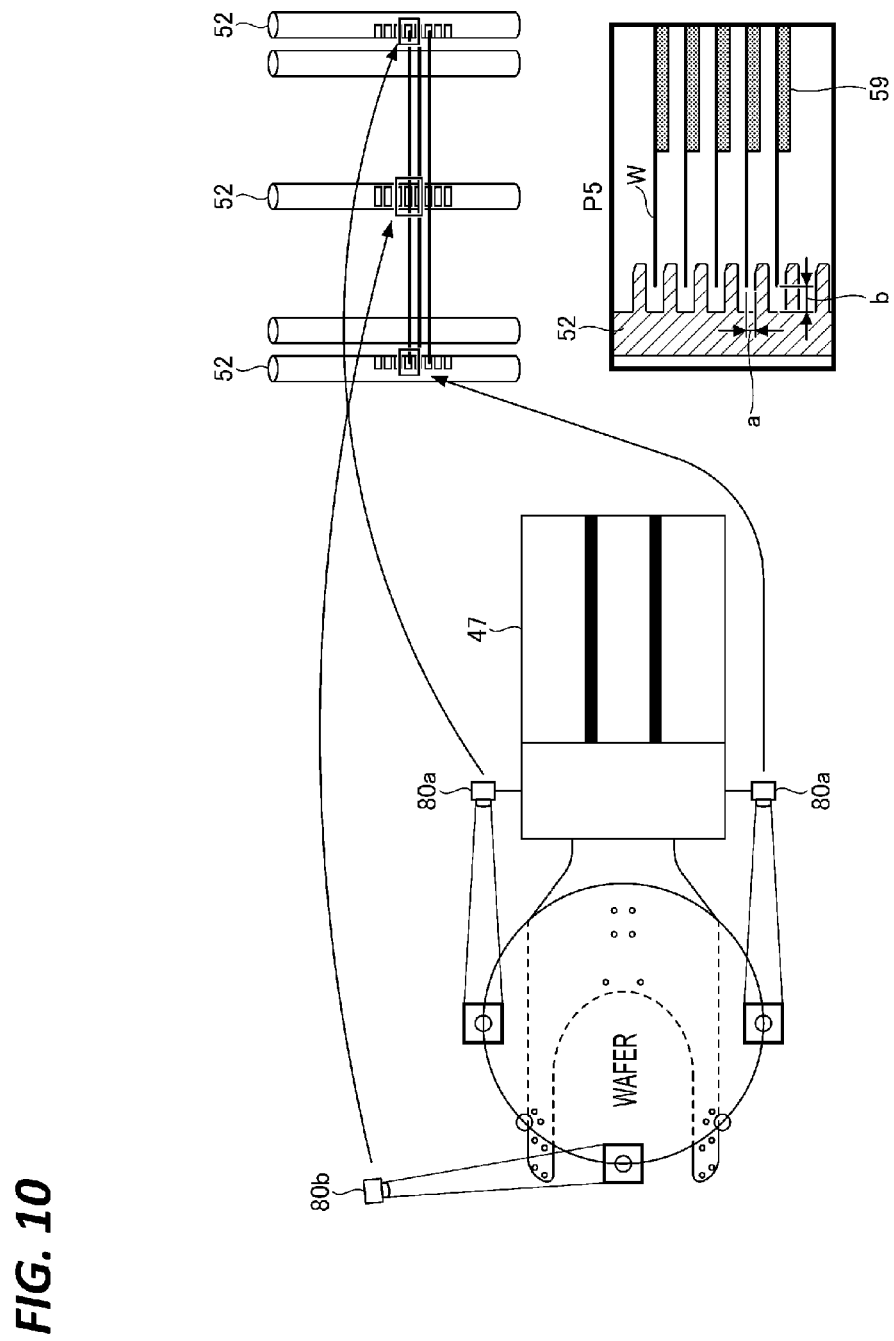
FIG. 10 is an image view of an example of a boat when forks are inserted to reach a position P5.

In step S82, based on the corrected teaching data, the autonomous control unit 130 controls the transfer device control unit 150, to insert the forks 59 to reach the position P5 of the boat 44a. According to the corrected teaching data, the transfer device control unit 150 controls the moving operation of the transfer mechanism 47 to insert the forks 59 to reach the position P5 of the boat 44a as illustrated in, for example, FIG. 10. FIG. 10 is an image view of an example of the boat when the forks are inserted to reach the position P5.

In step S84, the autonomous control unit 130 performs a control such that the camera 80a captures images at the position P5 of the boat 44a. The image data acquisition unit 110 acquires image data captured by the camera 80a at the position P5 of the boat 44a.

In step S86, the image processing unit 120 performs an image processing on the image data captured by the camera 80a at the position P5 of the boat 44a, to digitize the positional relationship among the boat groove, the fork 59, and the wafer W.

For example, the image processing unit 120 performs an image processing on the image data captured by the camera 80a at the position P5, to measure, for example, the distance "a" between the lower surface of the wafer W held by the fork 59 and the upper surface of the boat groove, and the distance "b" between the support column 52 and the edge of the wafer W.

In step S88, the autonomous control unit 130 determines whether the measured distances satisfy design reference values. When the design reference values are not satisfied, the autonomous control unit 130 performs a correction operation for the difference in step S90, and repeatedly performs the position correction of the moving operation of the forks 59 until the design reference values are satisfied.

When the design reference values are satisfied, the autonomous control unit 130 proceeds to the process of step S92. The autonomous control unit 130 performs a control such that the camera 80b captures an image at the position P5 of the boat 44a. The image data acquisition unit 110 acquires image data captured by the camera 80b at the position P5 of the boat 44a.

In step S94, the image processing unit 120 performs an image processing on the image data captured by the camera 80b at the position P5 of the boat 44a, to digitize the positional relationship among the boat groove, the fork 59, and the wafer W.

For example, the image processing unit 120 performs an image processing on the image data captured by the camera 80b at the position P5, to measure, for example, the distance "a" between the lower surface of the wafer W held by the fork 59 and the upper surface of the boat groove, and the distance "b" between the support column 52 and the edge of the wafer W.

In step S96, the autonomous control unit 130 determines whether the measured disclosures satisfy design reference values. When the design reference values are not satisfied, the autonomous control unit 130 performs a correction operation for the difference in step S98, and repeatedly performs the position correction of the moving operation of the forks 59 until the design reference values are satisfied.

In step S100, the autonomous control unit 130 performs a feedback by storing the corrected teaching data in the database 160, according to the result of the position correction of the moving operation of the forks 59 performed to satisfy the design reference values.

Figure 11:
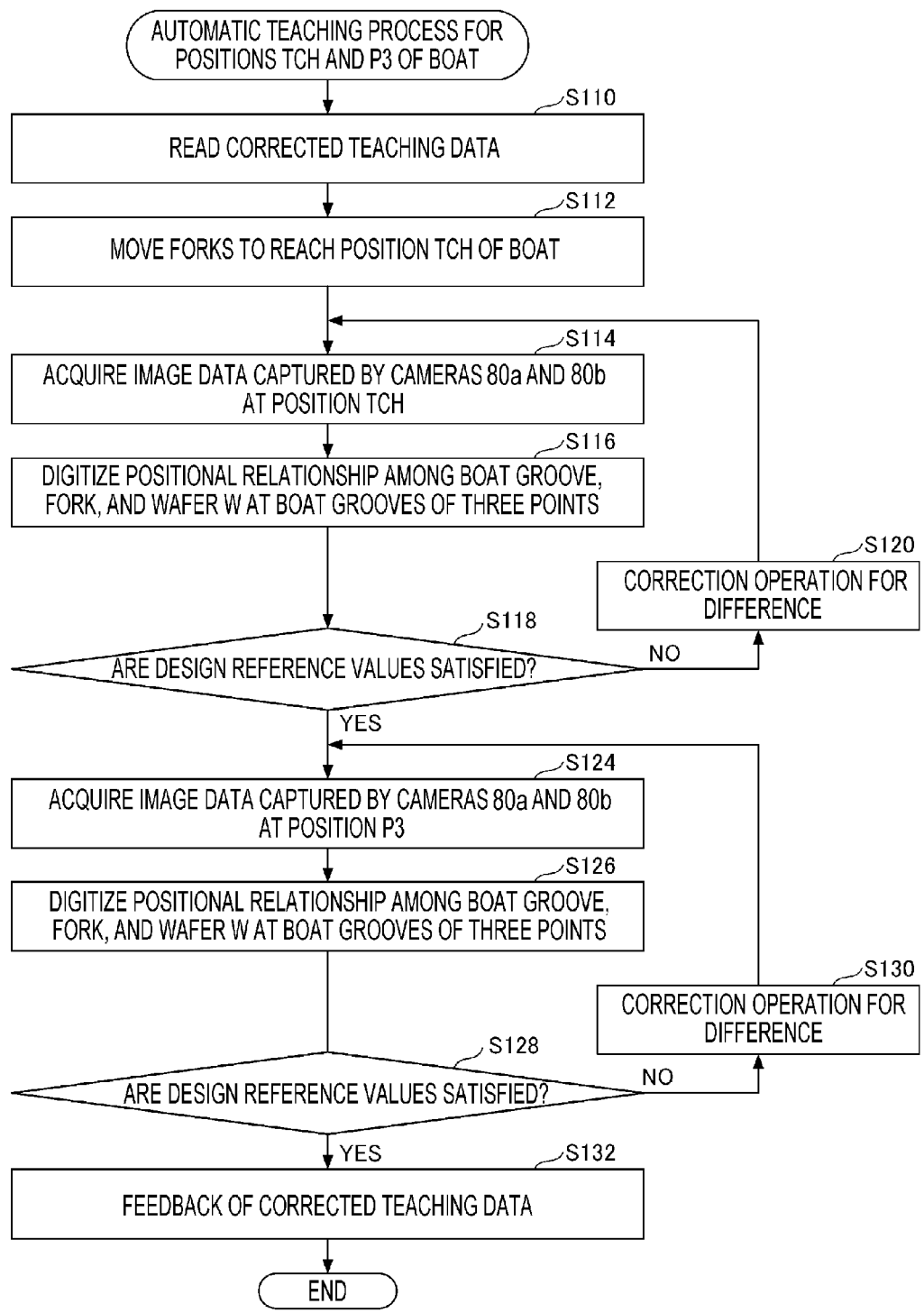
FIG. 11 is a flowchart of an example of an automatic teaching process for a boat according to an embodiment.

FIG. 11 is a flowchart of an example of the automatic teaching process for the boat according to the present embodiment. In step S110, the autonomous control unit 130 of the control device 100 reads the corrected teaching data from the database 160.

In step S112, based on the corrected teaching data, the autonomous control unit 130 controls the transfer device control unit 150 to move the forks 59 to the position TCH of the boat 44a. According to the corrected teaching data, the transfer device control unit 150 controls the moving operation of the transfer mechanism 47 to move the forks 59 to the position TCH of the boat 44a as illustrated in, for example, FIG. 12.

Figure 12:
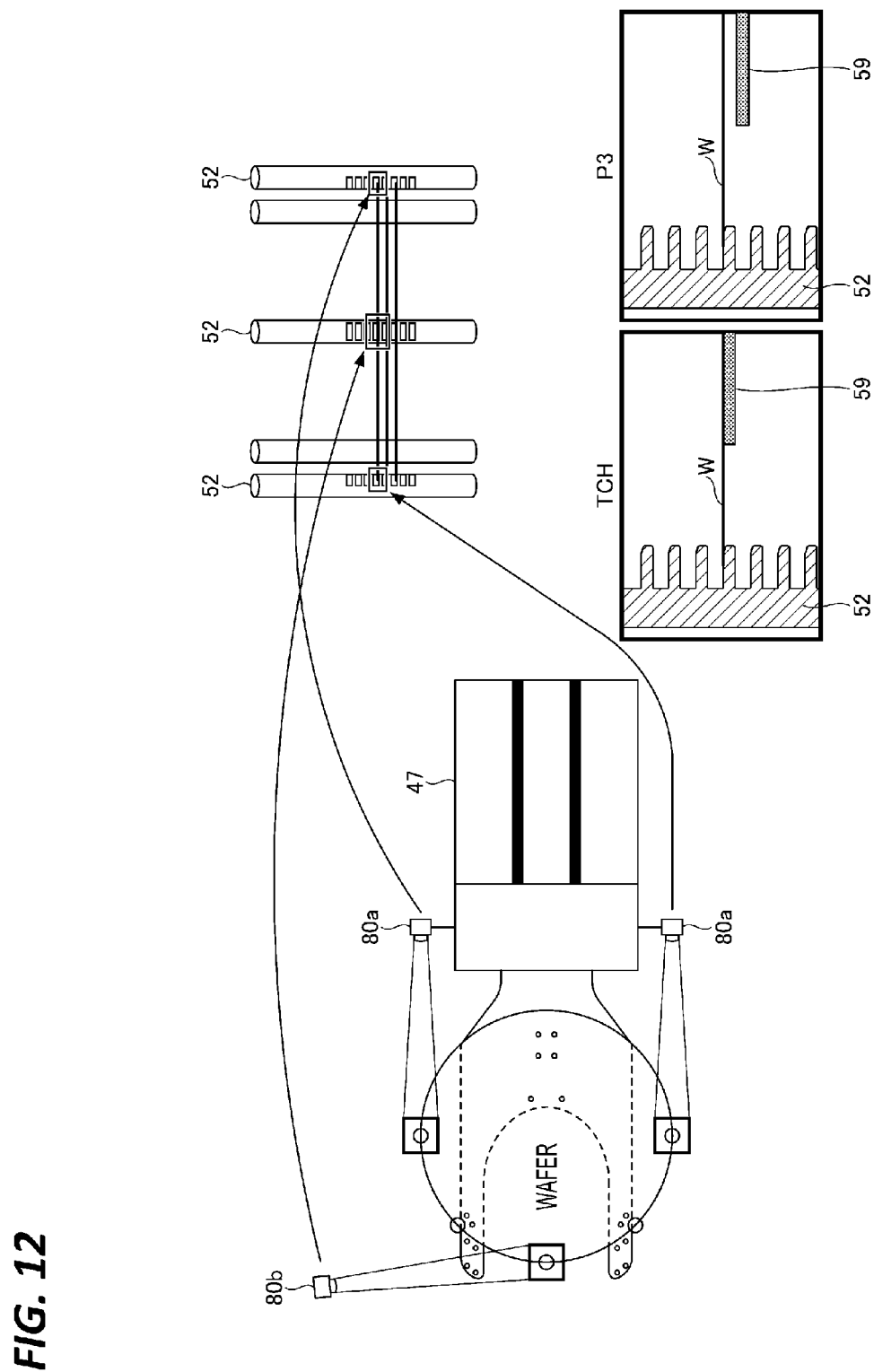
FIG. 12 is an image view of an example of a boat when a fork is inserted to reach positions TCH and P3.

FIG. 12 is an image view of an example of the boat when the fork is inserted to reach the positions TCH and P3. As illustrated in FIG. 12, the cameras 80a and 80b are provided to capture images of the boat grooves at the three points of the boat 44a.

In step S114, the autonomous control unit 130 performs a control such that the cameras 80a and 80b capture images at the position TCH of the boat 44a. The image data acquisition unit 110 acquires image data captured by the cameras 80a and 80b at the position TCH of the boat 44a.

In step S116, the image processing unit 120 performs an image processing on the image data captured by the cameras 80a and 80b at the position TCH of the boat 44a, to digitize the positional relationship among the boat groove, the fork 59, and the wafer W for the boat grooves of the three points.

For example, the image processing unit 120 performs an image processing on the image data captured by the cameras 80a and 80b at the position TCH, to measure, for example, the distance between the lower surface of the wafer W held by the fork 59 and the upper surface of the boat groove, and the distance between the support column 52 and the edge of the wafer W.

In step S118, the autonomous control unit 130 determines whether the measured disclosures satisfy design reference values. When the design reference values are not satisfied, the autonomous control unit 130 performs a correction operation for the difference in step S120, and repeatedly performs the position correction of the moving operation of the forks 59 until the design reference values are satisfied.

When the design reference values are satisfied, the autonomous control unit 130 proceeds to the process of step S124. The autonomous control unit 130 performs a control such that the cameras 80a and 80b capture images at the position P3 of the boat 44a. The image data acquisition unit 110 acquires the image data captured by the cameras 80a and 80b at the position P3 of the boat 44a.

In step S126, the image processing unit 120 performs an image processing on the image data captured by the cameras 80a and 80b at the position P3 of the boat 44a, to digitize the positional relationship among the boat groove, the fork 59, and the wafer W for the boat grooves of the three points.

For example, the image processing unit 120 performs an image processing on the image data captured by the cameras 80a and 80b at the position P3, to measure, for example, the distance between the lower surface of the wafer W held by the fork 59 and the wafer mounting surface of the fork 59, and the distance between the support column 52 and the edge of the wafer W.

In step S128, the autonomous control unit 130 determines whether the measured disclosures satisfy design reference values. When the design reference values are not satisfied, the autonomous control unit 130 performs a correction operation for the difference in step S130, and repeatedly performs the position correction of the moving operation of the forks 59 until the design reference values are satisfied.

In step S132, the autonomous control unit 130 performs a feedback by storing the corrected teaching data in the database 160, according to the result of the position correction of the moving operation of the forks 59 performed to satisfy the design reference values.

The accuracy of the process in the flowcharts illustrated in FIGS. 9 and 11 may be further improved by dividing the boat 44a into two upper and lower areas or three or more areas according to the height, and performing the process for each area.

According to the present embodiment, step S16 and its subsequent processes are performed at predetermined intervals under the operation of the thermal processing apparatus 10, so that the operation of the thermal processing apparatus 10 may be continued while correcting the position of the moving operation of the forks 59 to satisfy the design reference values. Thus, according to the present embodiment, the mean time between failures (MTBF) may be extended, and the operation rate may be improved so that the added value of the thermal processing apparatus 10 may be improved. Further, according to the present embodiment, the mean time to recovery (MTTR) may be reduced, and the operation rate and the quality may be improved so that the added value of the thermal processing apparatus 10 may be improved.

According to the present embodiment, for example, the behaviors of the transfer mechanism 47 and the boat 44 may be grasped by analyzing the displacement data stored in the database 160. Further, according to the present embodiment, an abnormality detection and a failure detection are facilitated by analyzing the displacement data stored in the database 160, so that the added value of the thermal processing apparatus 10 may be improved. For example, a thermal variation behavior of the thermal processing apparatus 10 may be logged by analyzing the displacement data stored in the database 160, so that it is possible to predict whether the variation data exceeds a physical variation amount indicated by a mechanical design before the exceeding, and therefore, an appropriate time for the maintenance may be notified.

According to the autonomous transfer process of the present embodiment, the MTBF caused by the transfer of the wafers W may be extended without exceeding a physical limit of the transfer mechanism 47 or a film formation distribution limit of a process. The film formation distribution limit of the process may be detected from, for example, a limit of an adjustment by an eccentric optimizer function.

According to the present embodiment, for example, a time for an adjustment work at the time of a start-up (installation of an apparatus) or after a replacement of a quartz jig may be reduced, as compared with an adjustment work by an operator, and further, a transfer margin resulting from a highly accurate adjustment may be increased. According to the present embodiment, it may be expected that the MTBF (mean time between failures) is extended as a result of the increase of the transfer margin, so that the added value of the thermal processing apparatus 10 may be improved.

In the present embodiment, an image processing is performed to digitize the positional relationship among the position of a support such as a groove or claw of the storage container 21 or 22, the position of a support such as a groove or claw of the boat 44a or 44b, the position of the fork 59 of the transfer mechanism 47, and the position of the wafer W. However, for example, an optical sensor may be used in combination. In the present embodiment, centering of the wafers W on the boat 44a or 44b may be implemented, and the inclination of the boat 44a or 44b based on the transfer mechanism 47 may be analyzed through a calculation. In the present embodiment, the positional deviation of the wafer W held by the fork 59 is analyzed from the image data captured by the camera 80b, and the difference of the positional deviation is corrected, so that the transfer of the wafers W may be continued.

In the embodiment described above, a so-called ladder boat is described in which a plurality of support columns is provided between a top plate and a bottom plate which are vertically arranged while facing each other, and a plurality of grooves is formed on the inner side surface of each support column, such that the peripheral edge of a wafer W is inserted into the grooves. However, the present disclosure is not limited to the shape of the ladder boat.

For example, the present disclosure may be applied to a so-called ring boat in which a plurality of support columns is provided between a top plate and a bottom plate which are vertically arranged while facing each other, and is provided with ring members each having a flat support surface to support a wafer W on the support surface of each ring member. The present disclosure may also be applied to other boats having a specific shape.

Next, the camera 80b will be further described with reference to FIGS. 13A and 13B. FIGS. 13A and 13B are views illustrating an example of the camera 80b. FIG. 13A illustrates a state where the camera 80b is disposed in a standby position, and FIG. 13B illustrates a state where the camera 80b is disposed in a measurement position. FIGS. 13A and 13B are plan views of the camera 80b, the support columns 52 of the boat 44, and the wafer W when viewed from above.

The back door 400 is provided in the rear side wall of the housing 30 forming the loading area 40, to transfer the replacement member such as the boat 44 into the loading area 40. The back door 400 is provided in the side wall (the rear side wall) opposite to the side wall (front side wall) on which the door mechanism 41 (see, e.g., FIG. 2) is provided, among the side walls of the housing 30. In other words, the back door 400 is provided opposite to the transfer mechanism 47 with respect to the boat 44, in the transfer direction of the transfer mechanism 47 when the wafers W are transferred to the boat 44. In the back door 400, openings 401A and 401B are provided.

The camera 80b includes camera bodies 801A and 801B, a support member 802, a drive unit 803, mirrors 804A and 804B, translucent members 805A and 805B, and bellows 806A and 806B.

The camera 80b includes the camera body 801A which is a light projecting unit, and the camera body 801B which is a light receiving unit. In FIGS. 13A and 13B, the dashed line arrows indicate the irradiation direction of light. The camera bodies 801A and 801B are arranged apart from each other in the horizontal direction, and are supported by the support member 802. The camera bodies 801A and 801B are disposed in an air atmosphere as described later.

The light irradiated from the camera body 801A passes through the translucent member 805A, is reflected on the mirror 804A, is further reflected on the mirror 804B, passes through the translucent member 805B, and is incident on the camera body 801B. As a result, the camera 80b may capture an image of an object disposed between the mirrors 804A and 804B. The camera body 801A is disposed in a direction in which light is irradiated in the inserting/removing direction of the opening 401A. The camera body 801B is disposed in a direction in which light is received in the inserting/removing direction of the opening 401B.

The support member 802 is divided into two parts, such that one of the parts is inserted into the opening 401A, and the other part is inserted into the opening 401B. One of the divided parts of the support member 802 that is inserted into the opening 401A supports the camera body 801A, the mirror 804A, and the translucent member 805A. The other part of the support member 802 that is inserted into the opening 401B supports the camera body 801B, the mirror 804B, and the translucent member 805B.

The drive unit 803 drives the support member 802 in the inserting/removing direction of the openings 401A and 401B of the back door 400. As a result, the drive unit 806 may move the camera bodies 801A and 801B between the standby position where the camera bodies 801A and 801B are separated from the boat 44 (see, e.g., FIG. 13A), and the measurement position where the camera bodies 801A and 801B approach the boat 44 (see, e.g., FIG. 13B).

The mirrors 804A and 804B are arranged inside loading area 40 having a vacuum atmosphere or an $N_2$ atmosphere. The mirrors 804A and 804B are supported by the support member 802, and move together with the camera bodies 801A and 801B. The mirror 804A reflects the light irradiated from the camera body 801A. The mirror 804B reflects the light reflected by the mirror 804A to be incident on the camera body 801B.

An expansible and contractable bellows 806A is provided between the translucent member 805A and the wall surface of the back door 400 in which the opening 401A is formed. Further, an expansible and contractable bellows 806B is provided between the translucent member 805B and the wall surface of the back door 400 in which the opening 401B is formed. The camera bodies 801A and 801B are arranged inside the bellows 806A and 806B. The translucent members 805A and 805B are supported by the support member 802, and move together with the camera bodies 801A and 801B. The bellows 806A and 806B expand and contract as the camera bodies 801A and 801B move. As a result, the inside of the loading area 40 may be made airtight. The inside of the bellows 806A and 806B has the air atmosphere. That is, the camera bodies 801A and 801B are arranged in the air atmosphere. Meanwhile, the mirrors 804A and 804B are disposed in the loading area 40 having the vacuum atmosphere. The translucent members 805A and 805B are arranged between the air atmosphere and the vacuum atmosphere ($N_2$ atmosphere).

Figure 14A:
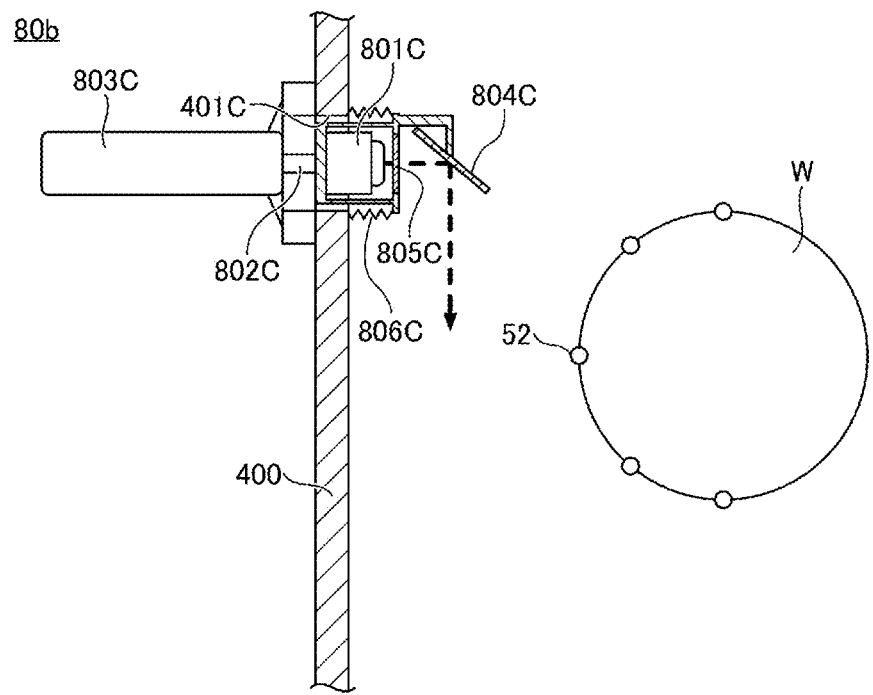
FIGS. 14A and 14B are views illustrating another example of the camera.
Figure 14B:
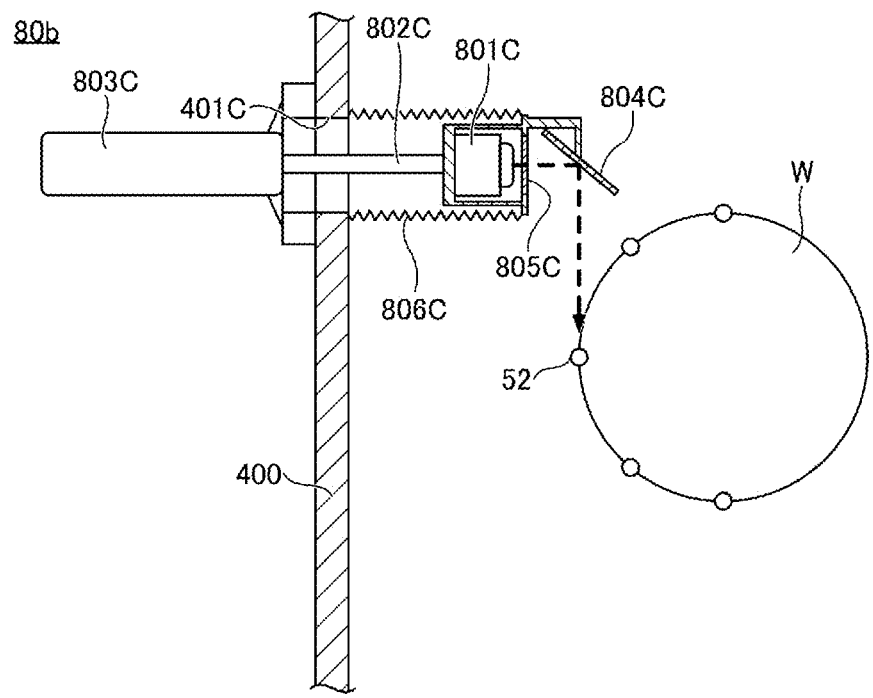

The configuration of the camera 80b is not limited to that illustrated in FIGS. 13A and 13B. FIGS. 14A and 14B are views illustrating another example of the camera 80b. FIG. 14A illustrates a state where the camera 80b is disposed in the standby position, and FIG. 14B illustrate a state where the camera 80b is disposed in the measurement position. FIGS. 14A and 14B are plan views of the camera 80b, the support columns 52 of the boat 44, and the wafer W when viewed from above.

An opening 401C is formed in the back door 400.

The camera 80b includes a camera body 801C, a support member 802C, a drive unit 803C, a mirror 804C, a translucent member 805C, and a bellows 806C.

The camera 80b includes the camera body 801C which is a light receiving unit. The camera body 801C is supported by the support member 802C. The camera body 801C is disposed in the air atmosphere as described later. Light of the camera body 801C passes through the translucent member 805C, and is reflected on the mirror 804C, so that an image is captured in the direction indicated by the dashed line arrows of FIGS. 14A and 14B.

The support member 802C is inserted into the opening 401C. The support member 802C supports the camera body 801C, the mirror 804C, and the translucent member 805C.

The drive unit 803C drives the support member 802C in the inserting/removing direction of the opening 401C of the back door 400. As a result, the drive unit 803C may move the camera body 801C between the standby position where the camera body 801C is separated from the boat 44 (see, e.g., FIG. 14A), and the measurement position where the camera body 801C approaches the boat 44 (see, e.g., FIG. 14B).

The mirror 804C is disposed in the loading area 40 having the vacuum atmosphere or the $N_2$ atmosphere.

A stretchable bellows 806C is provided between the translucent member 805C and the wall surface of the back door 400 in which the opening 401C is formed. As a result, the inside of the loading area 40 may be made airtight. The inside of the bellows 806C has the air atmosphere. That is, the camera body 801C is disposed in the air atmosphere. Meanwhile, the mirror 804C is disposed in the loading area 40 having the vacuum atmosphere. The translucent member 805C is disposed between the air atmosphere and the vacuum atmosphere ($N_2$ atmosphere).

According to the thermal processing apparatus 10 including the camera 80b illustrated in FIGS. 13A, 13B, 14A, and 14B, the camera bodies 801A, 801B, and 801C may be moved between the standby position where the camera bodies 801A, 801B, and 801C are separated from the boat 44 (see, e.g., FIGS. 13A and 14A) and the measurement position where the camera bodies 801A, 801B, and 801C approach the boat 44 (see, e.g., FIGS. 13B and 14B).

By moving the camera bodies 801A, 801B, and 801C to the standby position, the camera bodies 801A, 801B, and 801C may be separated from the boat 44. As a result, the heat from the boat 44 heated inside the thermal processing furnace 60 may be suppressed from being input to the camera bodies 801A, 801B, and 801C, so that the increase of the temperature of the camera bodies 801A, 801B, and 801C may be prevented.

A downflow gas flows in the loading area 40 in order to suppress particles. By moving the camera bodies 801A, 801B, and 801C to the standby position, an influence on the flow of the downflow gas may be suppressed.

When an image of an image capturing target (the support columns 52 of the boat 44 and the wafer W) is captured using the camera bodies 801A, 801B, and 801C, the camera bodies 801A, 801B, and 801C are moved to the image capturing position. As a result, the image capturing may be performed in the state where the camera bodies 801A, 801B, and 801C approach the image capturing target, so that the image accuracy may be improved.

The camera bodies 801A, 801B, and 801C are disposed inside the bellows 806A, 806B, and 806C having the air atmosphere. As a result, heat generated from the camera bodies 801A, 801B, and 801C may be dissipated to the air, so that the increase of the temperature of the camera bodies 801A, 801B, and 801C may be prevented. Further, the camera bodies 801A, 801B, and 801C may be prevented from being affected by, for example, a residual gas of the thermal processing furnace 60.

A lens such as a telecentric lens may be added to the camera bodies 801A, 801B, and 801C. The added lens may be disposed in the air atmosphere inside the bellows 806A, 806B, and 806C.

Figure 15:
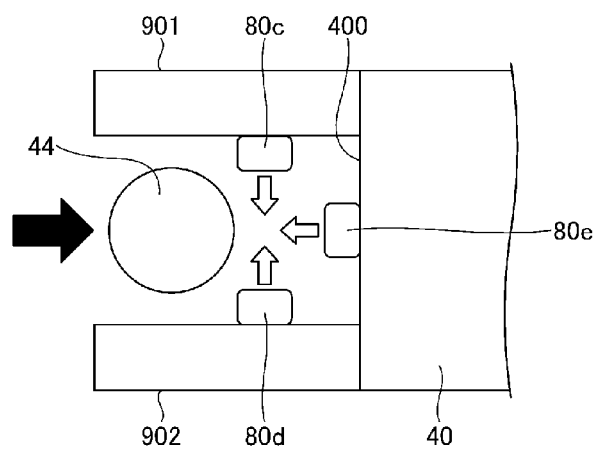
FIG. 15 is a top view illustrating an example of the thermal processing apparatus during a carry-in of the boat.

Next, descriptions will be made on a case where the replacement member such as the boat 44 is transferred from the back door 400 into the loading area 40. FIG. 15 is an example of a top view of the thermal processing apparatus 10 when the boat 44 is carried into the loading area 40.

In the space between the accommodation units 901 and 902, the maintenance space is formed adjacent to the back door 400 outside the loading area 40 (the housing 30). When the replacement member such as the boat 44 is transferred into the loading area 40 (see the black arrow), the replacement member passes through the maintenance space between the accommodation units 901 and 902.

Here, in the thermal processing apparatus 10, cameras 80c, 80d, and 80e are provided to capture an image of the replacement member (the boat 44) inside the maintenance space. For example, the camera 80c is provided on the wall surface of the accommodation unit 901, and captures an image of the inside of the maintenance space. The camera 80d is provided on the wall surface of the accommodation unit 902, and captures an image of the inside of the maintenance space. The camera 80e is provided on the wall surface of the housing 30, and captures an image of the inside of the maintenance space. The white arrows indicate an example of the directions in which the cameras 80c, 80d, and 80e capture images.

The control device 100 determines the shape of the member based on the images captured by the cameras 80c, 80d, and 80e, and determines whether the member of the captured images is a correct replacement member. Then, the control device 100 outputs the determination result to, for example, the output device 502, so as to notify the operator with the determination result. Thus, it may be determined whether the member of the captured images is a correct member, before the operator transfers the replacement member into the loading area 40 and installs the replacement member therein. As a result, the operator's retry for the replacement work may be prevented so that the work efficiency is improved.

At least one of the cameras 80c, 80d, and 80e may be made drawable. In this case, the operator draws the camera, and captures identification information such as numbers written on the replacement member with the drawn camera. Based on the identification information captured by the camera, the control device 100 determines whether the member of the captured image is a correct replacement member. Then, the control device 100 may output the determination result to, for example, the output device 502, so as to notify the operator with the determination result.

Since the cameras 80c, 80d, and 80e are provided outside the housing 30, the input of heat from the boat 44 heated inside the thermal processing furnace 60 may be prevented.

According to an aspect of the present disclosure, it is possible to provide a substrate processing apparatus and an image capturing method which capture an image of a transfer target.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate processing apparatus comprising:
   a chamber configured to accommodate a boat;
   a transfer mechanism including an arm and a fork, provided inside the chamber, and configured to transfer a substrate;
   a first camera configured to capture an image of a support column of the boat and the substrate;
   a camera support inserted through an opening formed in a wall surface of the chamber, and configured to support the first camera; and
   a driver configured to drive the camera support in order to move the first camera between a standby position and a measurement position.

2. The substrate processing apparatus according to claim 1, further comprising:
   a bellows configured to expand and contract with a movement of the first camera,
   wherein the first camera is disposed inside the bellows having an air atmosphere.

3. The substrate processing apparatus according to claim 1, further comprising:
   a translucent piece moving together with the first camera, and provided in an image capturing direction of the first camera.

4. The substrate processing apparatus according to claim 1, further comprising:
   a mirror configured to move together with the first camera, and provided in an image capturing direction of the first camera.

5. The substrate processing apparatus according to claim 1, further comprising:
   a back door provided in the wall surface of the chamber, and configured to transfer the boat into the chamber,
   wherein the opening is provided in the back door.

6. The substrate processing apparatus according to claim 5, further comprising:
   a maintenance space adjacent to the back door outside the chamber; and
   a second camera provided to pass through the maintenance space, and configured to capture an image of a replacement target.

7. The substrate processing apparatus according to claim 1, further comprising:

a third camera provided in the transfer mechanism, and configured to capture an image of the support column of the boat and the substrate.

8. An image capturing method comprising:
providing a substrate processing apparatus including:
- a chamber configured to accommodate a boat;
- a transfer mechanism including an arm and a fork, provided inside the chamber, and configured to transfer a substrate; a first camera configured to capture an image of a support column of the boat and the substrate;
- a camera support inserted through an opening formed in a wall surface of the chamber, and configured to support the first camera; and
- a driver configured to drive the camera support, in order to move the first camera between a standby position and a measurement position, moving the first camera to the measurement position, and
capturing an image of the support column of the boat and the substrate by the first camera.

* * * * *